United States Patent [19]

Bauchet

[11] Patent Number: 4,531,791
[45] Date of Patent: Jul. 30, 1985

[54] FEED-THROUGH FOR HYBRID CIRCUIT BOX AND MATCHING CONNECTORS

[75] Inventor: Bernard Bauchet, La Frette, France

[73] Assignee: Sintra-Alcatel, Asnieres, France

[21] Appl. No.: 469,062

[22] Filed: Feb. 23, 1983

[30] Foreign Application Priority Data

Feb. 24, 1982 [FR] France .............................. 82 03035

[51] Int. Cl.³ ..................... H01R 23/12; H01R 11/16
[52] U.S. Cl. .............................. 339/14 R; 174/50.61;
 339/32 R; 339/176 M; 339/210 M
[58] Field of Search .............. 339/14 R, 14 P, 17 LC,
 339/17 LM, 19, 32, 33, 49, 60, 63, 150 T, 176
 M, 191, 192, 198 R, 198 S, 198 P, 258 R, 258 P,
 275 R, 275 T, 210 R, 210 M; 174/52 S, 52 FP,
 50.61–50.64

[56] References Cited

U.S. PATENT DOCUMENTS

| | | | |
|---|---|---|---|
| 1,628,569 | 5/1927 | Worthington | 339/143 R |
| 2,059,008 | 10/1936 | Marquart | 339/60 R |
| 2,904,771 | 9/1959 | Burtt et al. | 174/50.61 |
| 3,006,984 | 10/1961 | Bol | 174/50.61 |
| 3,296,577 | 1/1967 | Travis et al. | 339/275 R |
| 3,327,279 | 6/1967 | Lombard | 339/19 |
| 3,614,706 | 10/1971 | Kulka | 339/14 R |
| 3,953,099 | 4/1976 | Wilson | 339/60 M |
| 4,392,705 | 7/1983 | Andrews, Jr. et al. | 339/17 LC |

FOREIGN PATENT DOCUMENTS

| | | | |
|---|---|---|---|
| 1135542 | 8/1962 | Fed. Rep. of Germany | 339/198 |
| 1151582 | 7/1963 | Fed. Rep. of Germany | . |
| 2652262 | 5/1978 | Fed. Rep. of Germany | . |
| 907845 | 10/1962 | United Kingdom | 339/63 M |
| 1001210 | 8/1965 | United Kingdom | 339/32 R |
| 2025158 | 1/1980 | United Kingdom | 339/143 R |

OTHER PUBLICATIONS

Electronics vol. 46, No. 12, Jun. 7, 1973, N. Y. US L. Altman: "Hybrid Technology Solves Tough Design Problems", pp. 89–104.

*Primary Examiner*—Neil Abrams
*Attorney, Agent, or Firm*—Sughrue, Mion, Zinn, Macpeak, and Seas

[57] ABSTRACT

A feed-through (2) is in the form of a generally cylindrical pin extending through the thickness of the wall of the box (1). Its end projecting outside the box is terminated by a generally cylindrical head portion (23) of greater outside diameter than the rest of the pin, said head portion is fixed at a distance from the wall of the box and is provided with an axial bore (24) suitable both for receiving a contact of an external connector and for receiving a conductor lead to be soldered thereto, depending on the requirements of a user.

7 Claims, 11 Drawing Figures

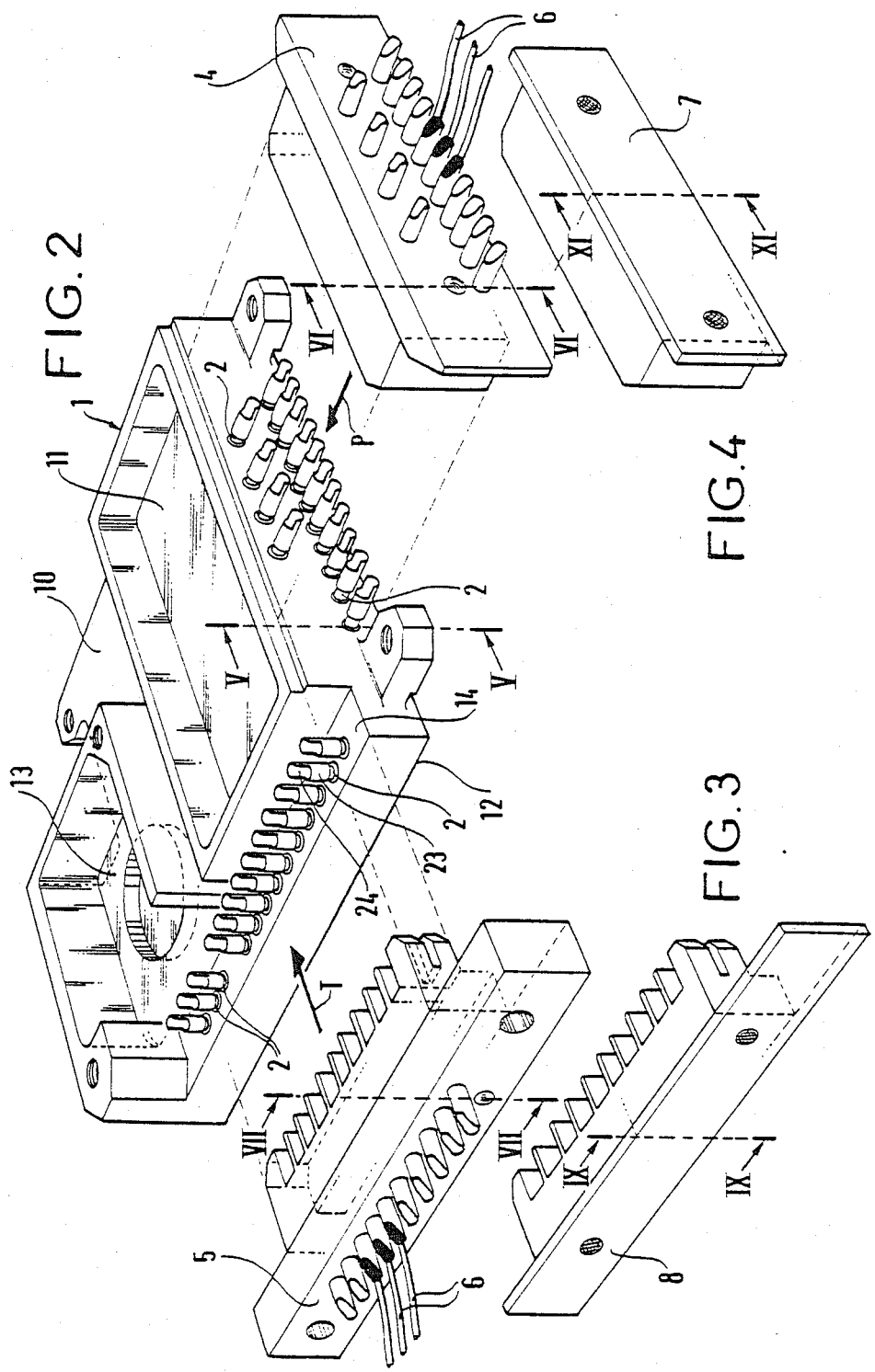

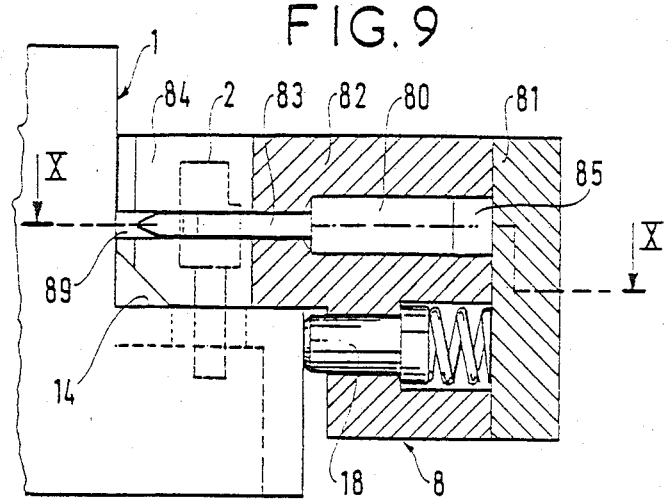
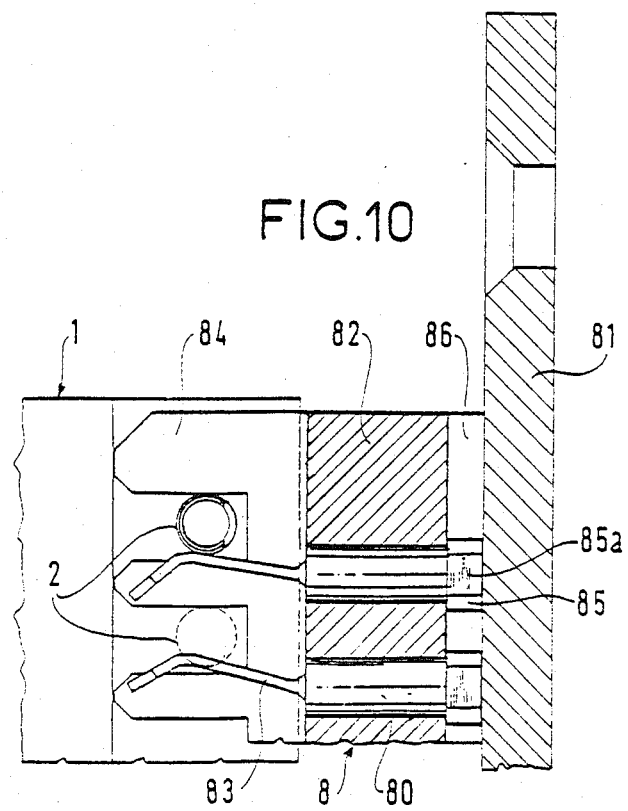

ered connections. Feed-throughs which project a
FEED-THROUGH FOR HYBRID CIRCUIT BOX AND MATCHING CONNECTORS The present invention relates to making connections between hybrid circuits which are mounted inside hermetically sealed metal boxes and other circuits outside the boxes. Such connections are made via electric feed-throughs in the form of metal pins which pass through the wall of the box, and which are both sealed thereto and insulated therefrom by means of respective beads of glass. More particularly the present invention relates to such feed-throughs which are capable of being used either for direct soldered connection to conductor leads or for releasable connection to a connector, depending on a user's requirements. For example, a hybrid circuit could be tested after its box has been closed using a releasable connection, and if the test is satisfactory, the same circuit could be soldered via the same feed-throughs to conductor leads in a larger item of equipment. The invention also relates to connectors suitable for connecting to said feed-throughs.

BACKGROUND OF THE INVENTION

It is common practice in the microelectronic art for connections to hybrid circuits which are housed in sealed metal boxes to be made via feed-throughs in the form of little metal pins which pass through the thickness of the box wall with each pin being sealed to the wall and insulated therefrom by a bead of glass. The pins project inside the box for connection to the hybrid circuits housed therein, and outside the box for connection to circuits external thereto. Generally speaking, for connection to an external circuit, the pins either project a short way outside the box, in which case they are intended for connection to a complementary connector, or else they project a relatively long way, in which case they are intended for individual connection to conductor leads. The leads are usually wound round the corresponding pins and then soldered thereto.

Feed-throughs that project only a short way outside the box have the advantage being more compact than long feed-throughs, but they cannot be used for direct soldered connections. Feed-throughs which project a long way outside the box naturally increase the overall outside dimensions of the box, and even though they are specifically intended for direct soldered connections, in practice great care must be taken to avoid accidental short circuits between pins or between a pin and the box. Short circuits can arise either by excess solder, or by the pins being bent.

In a first aspect, preferred embodiments of the present invention provide feed-throughs for metal boxes housing hybrid circuits which feed-throughs are equally suitable for connection to external circuits by direct soldering or by a releasable connector, depending on user requirements.

SUMMARY OF THE INVENTION

The present invention provides a feed-through for a hybrid circuit box, the feed-through being in the form of a generally cylindrical pin extending through the thickness of the box wall with first and second ends projecting respectively inside the box and outside the box, said first end being for connection to a hybrid circuit, the improvement wherein the second or outside end of the feed-through is terminated by a generally cylindrical head portion of greater outside diameter than the rest of the pin, said head portion being fixed at a distance from the wall of the box and being provided with an axial bore open at the end of the feed-through and suitable both for receiving a contact of an external connector and for receiving a conductor lead to be soldered thereto, depending on the requirements of a user.

The head portion is preferably generally scoop-shaped, thus providing means for easily holding the end of a conductor lead and for holding solder so that there is little danger of short circuits being made by solder bridges. Also, because the pins project a relatively short way outside the box, the overall bulk of the box is not excessively increased, and the danger of the pins being bent into contact with one another is reduced. However, the larger diameter head can encourage damage to the glass bead if the glass makes contact therewith. Also, there could be a risk of shorting to the box. It is thus important that the head is held at a distance from the box wall, even though at first sight it might appear that this should be avoided to keep down overall bulk.

In a second aspect preferred embodiments of the present invention provide connectors which are complementary to the above-defined feed-throughs. Such connectors can be made to be reliable even under conditions of high vibration, thereby making them suitable both for temporary connections, eg. during product testing, and for semi-permanent connections, eg. to the equipment in which the hybrid circuits are used.

The present invention thus also provides a complementary connector releasably connectable to a row of feed-throughs as defined above, wherein the connector comprises a plurality of cylindrical conductive contacts in the form of longitudinally split pins, each having a first end portion of suitable length and diameter to be received axially in the bore of a corresponding feed-through head portion, and being held in fixed feed-through matching relationship relative to the other split pins by a support, said support having a first plane surface at a level close to tips of the split pins and having split-pin receiving bores of diameter slightly larger than the outside diameter of the head portions, whereby the head portions are received in said bores when the connector is connected to said row of feed-throughs.

In an alternative arrangement the present invention provides a complementary connector releasably connectable to a row of feed-throughs as defined above, wherein the connector comprises a plurality of conductive contacts held fixed in feed-through matching relationship relative to one another in a support, said support being comb-shaped and having teeth suitable for engaging in between said feed-throughs, said teeth being split in two by a longitudinally extending slot which receives first end portions of said contacts, each of said first end portions being in the shape of a bent blade resiliently mounted on the rest of contact, said bent blades being held to engage corresponding feed-throughs tangentially when said teeth are inserted in between said feed-throughs.

BRIEF DESCRIPTION OF THE DRAWINGS

Embodiments of the invention are described by way of example with reference to the accompanying drawings, in which:

FIG. 2 is a perspective view similar to FIG. 1, showing the feed-throughs in association with mating connectors;

FIGS. 3 and 4 are perspective views of two variant connectors;

FIG. 9 is a section along a line IX—IX in FIG. 3;

FIG. 10 is a section along a line X—X in FIG. 9; and

MORE DETAILED DESCRIPTION

Figure 1:
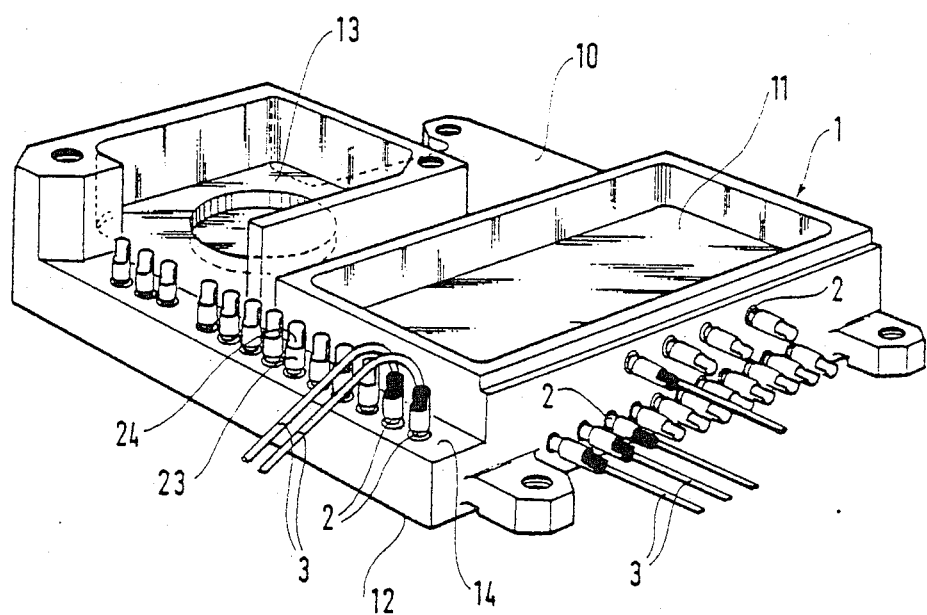
FIG. 1 is a perspective view of a hybrid circuit box fitted with feed-throughs in accordance with the invention, shown soldered to conductor leads.

FIGS. 1 and 2 show a metal box 1 for a hybrid circuit. The box 1 is shown open, ie. before being closed and hermetically sealed. The box comprises a central partition 10 on which three independent compartments 11, 12 and 13 are mounted. Two of the compartments 11 and 13 are on that side of the partition 10 which is visible in the drawings, while the other compartment 12 is on the other, or hidden, side thereof. The compartments 11 and 12 are intended to receive respective hybrid circuits. The box is fitted with three rows of feed-throughs 2, each of which passes through a wall of the box via a hermetic seal which also serves to insulate the feed-through from the box. Each feed-through thus has one end outside the box, and its other end in one or other of the hybrid circuit compartments 11 and 12.

The feed-throughs 2 are for making electrical connections between hybrid circuits housed in the compartments 11 and 12 and circuits outside the box 1. In accordance with the invention, the feed-throughs 2 are suitable for fixed or for releasable connection to outside circuits, depending on user requirements. Thus, as can be seen in FIG. 1, each feed-through has a scoop-shaped head for receiving the tinned end of a lead for direct soldering. However, as shown in FIG. 2, the same feed-throughs can alternatively be releasably connected on a temporary or on a semi-permanent basis by means of complementary connectors 4 and 5. The connectors are shown soldered to leads 6, however, they could be suitable for connection by other means, eg. by crimping or by direct soldering to a circuit card.

FIGS. 3 and 4 show similar complementary connectors 7 and 8 respectively, but which are intended to connect the hybrid circuits to the reference potential of the box 1 in which they are housed.

The feed-throughs 2 suitable for soldering directly to conductor leads or for connecting via connectors are described below in greater detail, as are their complementary connectors, with reference to FIGS. 1 to 4, and more particularly with reference to each of the subsequent figures considered in turn.

Figure 5:
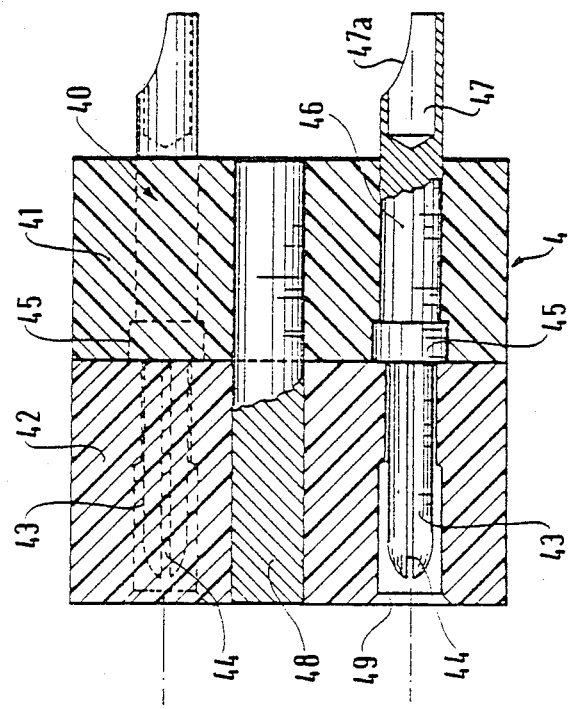
FIG. 5 is a section along a line V—V in FIG. 2, showing a feed-through where it passes through the box wall.

FIG. 5 is a section along a line V—V in FIG. 2. The plane of the section passes through a first feed-through 2 which passes through the wall of the box 1 to make a connection to the compartment 12. A second feed-through 2 which makes a conection to the compartment 11 is also shown in FIG. 5, but it lies behind the plane of the section.

Each feed-through is in the form of a generally cylindrical pin which is individually sealed in a hole through the wall of the box 1 by a bead of glass 15. The inside end 21 of each pin has a flat 22 for facilitating connection to a lead connected to a hybrid circuit (not shown) housed in the corresponding compartment. The connection may advantageously be made by ultrasonic welding or by thermo-compression.

The outside end of each pin has a cylindrical scoop-shaped head 23 of greater diameter than the rest of the pin. The head 23 has a bore 24 running along the axis of the pin, an open end extending into a cut-away opening 25 in a portion of the head's tubular wall, and a chamfered lip 26. It will be appreciated that these features facilitate insertion of a lead into the scoop-shaped end of the pin.

The pin's solid cylindrical portion of smaller diameter projects a small way from the outside face of the box wall thereby holding the larger diameter head 23 off the wall. This arrangement ensures that the glass of the bead 15 does not come into contact with the head, since such contact would make the glass more fragile.

The pins should be made from a conductive material having a coefficient of thermal expansion which compatible with that of the glass. A preferred material is an alloy of iron, nickel and cobalt of the kind sold under the commercial names Kovar or Dilver P1. The surface of the pins needs to be suitably treated to ensure relaible sealing to the glass bead.

In one specific embodiment, the pin's solid cylindrical body is 0.8 mm in diameter, while the head 23 has an outside diameter of 1.6 mm and is 2.8 mm long. The bore is about 1.2 mm long, with its cut-away opening extending up to 1 mm. With such dimensions, the back of the head 23 should be at least 1 mm away from the box wall.

With reference to FIGS. 1 to 5, it can be seen that feed-throughs in accordance with the invention present numerous advantages, including the following:

(1) tinned leads 3 (see FIG. 1) can be soldered directly thereto, with the scoop-shaped head ensuring that there is very little risk of drops of solder making accidental short circuits with the box wall;

(2) good quality, reliable soldering is promoted by the cut-away opening 25 which both facilitates conductor lead access, and enables gases to escape during soldering; and (3) the total outside length of the pins can be very short, which makes it possible not only to mount the pins so they project out perpendicularly from a wall of the box 1, as shown in FIG. 5, but also to mount the pins so that they extend parallel to the wall on which they are mounted, ie. projecting from a ledge 14 made in the wall. Soldering can still be performed in such a configuration, and not only is a hybrid circiut fitting as a whole made more compact, but the connections are given excellent protection against mechanical or thermal shocks, and also against vibration.

There is no need to make any modifications to the feed-throughs described above in relation to soldered connections when it is desired to make a connection by means of a connector. Connectors may be plugged-in axially relative to the pins or transversally, depending on the design of the connector.

Figure 6:
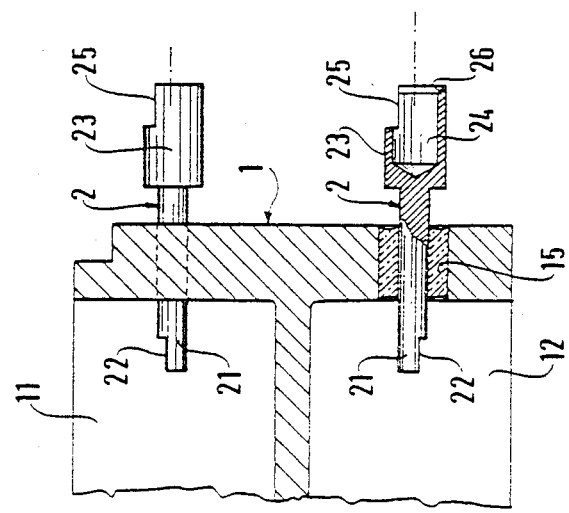
FIG. 6 is a section along a line VI—VI in FIG. 2 showing one of the complementary connectors.

FIG. 6 is a section through a connector 4 taken along a line VI—VI in FIG. 2. The connector is suitable for axial connection with pins projecting perpendicularly from a wall of the box 1. This is shown by an arrow P in FIG. 2.

The connector 4 has two rows of contacts 40 disposed to mate with the two parallel rows of pins on the box 1. The contacts 40 are mounted in insulating support members 41 and 42.

Thus each contact 40 includes a first end portion 43 in the form of a split pin having a rounded tip suitable for mating in the bore 24 of the corresponding feed-through head. In other words the outside diameter of the split pin in the rest position is slightly too large, but when the two halves are pushed towards each other into the intervening slot 44, the pin is received in the bore, and there is a resilient contact-maintaining force between the split pin and the bore.

In a variant, not shown, the split pin could be split into more than two parts, eg. having three or four parts and the slot 44 would then become a start or a cross when viewed end on.

Each contact 40 then includes an intermediate portion having a collar 45 for holding the contact axially in place in the insulating members 41 and 42.

Finally, each contact 40 includes a second end portion 46 suitable for soldering to connector leads. Thus each second end portion 46 is of similar structure to the heads 23 and comprises a scoop-shaped end with a bore 47 and a cut-away portion 47a of the tubular wall of the bore 47.

The contacts 40 should be made of an alloy, such as the copper alloy known as C97, which has high conductivity, is easy to machine, and which has stable elasticity over the required temperature range (eg. $-55°$ C. to $+125°$ C.) without requiring any heat treatment after machining. The above requirements are commonplace in connector specifications.

For protection against corrosion and to ensure continuing good contact, the contacts are electrolytically coated with a 4 micron layer of nickel which in turn is coated with a 2.5 micron layer of gold. Such surface coating is performed before calibrating the mating forces of the contacts 40 and the feed-throughs 2.

The forces are calibrated by forcing a suitable wedge into the slot or slots 44 of the split first end portion 43. The force applied to the wedge and the distance it is moved into the slot determine the contact forces. The resulting contact force may be checked by letting flyweights slide over the contacts 40 under the effect of gravity.

Each of the contacts 40 is held fast between the pair of insulating members 41 and 42 which fixed together either by means of screws or by force-fit dowels such as the dowel 48. The members 41 and 42 have bores corresponding to the positions of the contacts 40, and the bores in the member 41 are counter-sunk at the face which comes into contact with the member 42 in order to receive the collars 45. The split first ends 43 of the contacts 40 are entirely housed inside their corresponding bores in the member 42, which bores are of slightly larger inside diameter than the scoop-shaped heads 23 over a suitable length for receiving them, and have flared open ends 49 for guiding the heads 23 of the pins 2 during axial connecting motion. The rounded tips of the split first ends 43 may either stop a little way short of the front face of the connector 4 (as shown), or else they may be flush therewith.

The contacts 40 are a slightly loose fit in the bores through the insulating member 41 in order to leave enough play to compensate for any dimensional inaccuracies which might otherwise be a problem when connecting the connector on the feed-throughs 2. The second or scoop-shaped ends 46 of the contacts 40 project out from the insulating member 41 to facilitate soldering leads thereto.

Advantageously the insulating members 41 and 42 are made of a polycarbonate or an equivalent material which is both a good insulator and is sufficiently rigid, even when heated. The two members 41 and 42 can then be moulded independently. Alternatively, in some applications it is possible to mould the two members 41 and 42 as a single piece, providing the material used is one which will accept contacts 40 as a force fit and will then keep them properly in position.

Figure 7:
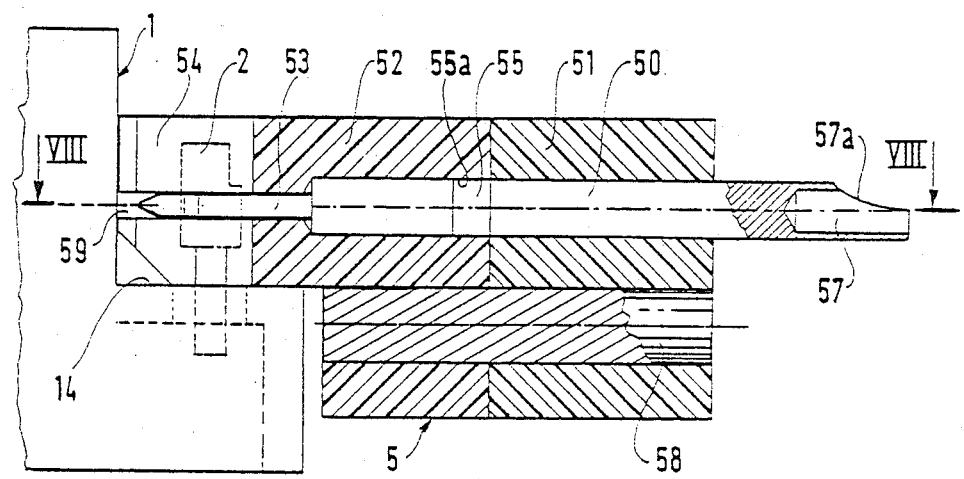
FIG. 7 is a section along a line VII—VII in FIG. 2 showing another one of the complementary connectors.
Figure 8:
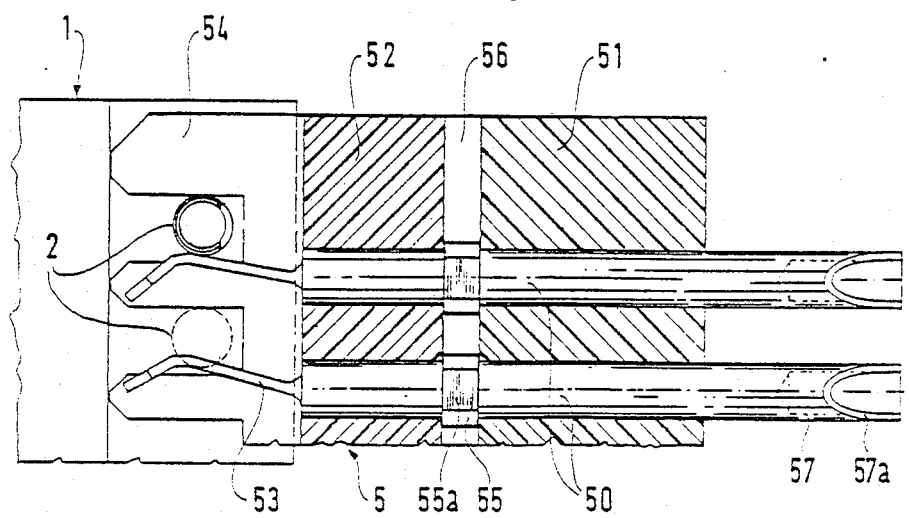
FIG. 8 is a section along a line VIII—VIII in FIG. 7.

FIGS. 7 and 8 are two different sections through a connector 5 shown in FIG. 2. FIG. 7 is a section along a line VII—VII in FIG. 2 and FIG. 8 is a section along a line VIII—VIII in FIG. 7. The connector 5 is associated with the feed-throughs which extend parallel to the box wall to which they are fitted, standing like a row of teeth on the ledge 14. The connector 5 makes contact by moving at right angles to the axis of the feed-through pins, along the direction of an arrow T, see FIG. 2.

The connector 5 has a single row of contacts 50, matching at least a portion of the row of feed-throughs. The contacts 50 are held in an insulating support comprising first and second insulating members 51 and 52.

The contacts 50 are generally cylindrical in shape, and each has a first end portion 53 in the form of a bent blade of rectangular section. The blade is resiliently mounted on the end of a rigid contact rod and it is so shaped that it presses tangentially against a corresponding one of the feed-throughs 2 when the connector 5 is in place. The middle of each rigid rod has two ears 55 extending radially therefrom together with associated flats 55a, for the purpose of preventing the contacts from rotating or moving axially in their insulating support. Finally the opposite or second end portions of the contacts 50 project from the opposite side of the insulating suport and are again scoop-shaped with a bore 57 and a cut-away portion 57a, for easy soldering to a connector lead 6 (see FIG. 2).

The insulating support member 52 which is nearer to the feed-throughs when connected thereto is generally comb-shaped having teeth 54 which engage in between the feed-throughs 2. Further, the teeth 54 together make up a second ledge complementary to the ledge 14 whereby the two ledges overlap when the connector 5 is connected to the box 1.

The two insulating support members 51 and 52 have suitable contact-receiving bores passing right through them when assembled, and they are themselves held together either by force fit dowels 58 as shown, or else by screws.

In the insulating member 51, the bores are cylindrical and of substantially the same diameter as the rigid cylindrical contact rods. They receive the contacts 50 over that portion of their length which extends from the ears 55 to the beginning of the scoop-shaped second end portions which project outside the insulating member 51. The bores through the other insulating member 52 are likewise cylindrical, and they lead to a longitudinally extending slot 59 which cuts the teeth 54 in half. The insulating portion 52 receives the ears 55 and the flats 55a of the contacts 50 in a pair of grooves 56 running along the opposite face to the teeth 54 and making ear-receiving contact with the bores. The bores receive the rigid rod portions of the contacts 50 up from the ears 55 to the base ends of the bent blades 53 which project out from the bores into the slot 59 between the teeth 54, ie. about half way up the teeth.

It can be seen from FIGS. 7 and 8 that the bent blades 53 make resilient contact with the sides of the feed-throughs 2, and the purpose of giving the bent blades a rectangular section is to improve the electrical contact they make with the feed-throughs.

In practice the contacts 50 are made from a beryllium bronze (Cu, Be, 1.9 Pb) in the half work-hardened state, which is then tempered to between 315° C. and 320° C. and quenched under an inert atmosphere (Nitrogen-Hydrogen) to ambient temperature. The insulating support members 51 and 52 are made from the same sort of material as the insulating support members of the connector 4.

Both types of connector described, whether the axial mating type 4 or the transverse mating type 5, give reliable and rapidly releasable connections with feed-throughs 2 on boxes for hybrid microelectronic circuits. They can be connected and disconnected frequently, as is often required during manufacture, adjustment or testing. Testing may, for example, include vibration and mechanical shock tests performed on the electronic circuits while they are powered up and operating.

Nonetheless, such connectors are also useable as semi-permanent connectors for receiving the circits during normal operation.

Figure 11:
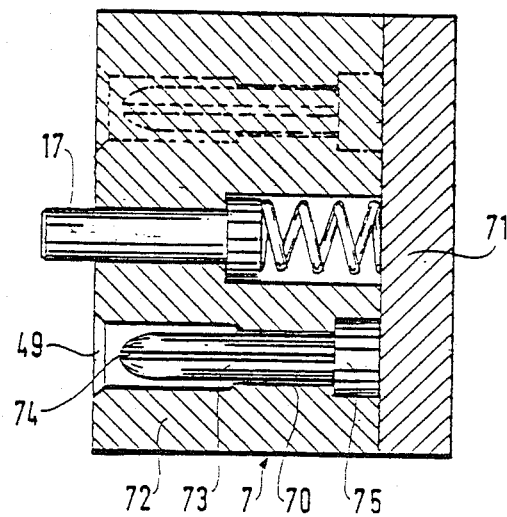
FIG. 11 is a section along a line XI—XI in FIG. 4.

FIGS. 9, 10 and 11 show the shorting connectors 8 and 7 which are derived from the ordinary connectors 4 and 5 described above. The shorting connectors are used while connecting the electronic circuits inside the box to the feed-throughs, and also to temporarily shut off circuits in a box 1.

The connector 8 shown in FIG. 3 and in more detail in FIGS. 9 and 10 is a modification of the connector 5 described with reference to FIGS. 7 and 8. Thus comparable parts in the two connectors 5 and 8 have similar reference numerals, which differ only in the first digit which is a "5" or an "8" as the case may be.

Contacts 80 in the connector 8 are cut short after the ears 85 since they do not need to be individually connected to conductor leads, and they are supported in two metal support members 82 and 81 which serve to provide permanent electrical interconnection between the contacts 80.

Further, the member 81 has a spring loaded contact shoe 18 disposed beneath the contacts 80 (in FIG. 9) and projecting to make contact with the wall of the box 1 under the ledge 14 from which the feed-throughs 2 project.

Under such conditions, when the connector 8 is applied to the feed-throughs 2 on the ledge 14, the shoe 18 ensures that the feed-throughs are connected to the reference potential of the box 1, with the connection being established through the metal bodies of the members 81 and 82.

The shorting connector 7 shown in FIG. 4 is shown in greater detail in FIG. 11. It is related to the connector 4 described with reference to FIG. 6. Thus comparable parts in the two connectors 4 and 7 have similar reference numerals, which differ only in the first digit which is a "4" or a "7" as the case may be.

In the connector 7, the contacts 70 comprise only the first end portion 73 in the form of a plit pin extending up as far as the collar 75. The second end portion for connection to conductor leads is not required.

The contacts 70 are housed in a conductive support member 72 and are locked in place by a conductive back plate 71. A spring loaded shoe 17 serves to make contact with the box 1, thereby ensuring that, when the shorting connector 7 is applied to the box 1, the feed-throughs 2 are not only connected to one another, but also to the reference potential of the box.

I claim:

1. In combination, a complementary assembly, a hybrid circuit box, said hybrid circuit box having a box wall, a row of feed-throughs projecting through said box wall, glass beads borne by said box wall, each feed-through being in the form of a generally cylindrical pin extending through the thickness of the box wall with first and second ends projecting respectively inside the box and outside the box, said pins being mounted within said box wall by said glass beads such that said pins are sealed by said glass beads and insulated thereby from said box wall, and wherein said through-hole pins have a coefficient of expansion compatible to that of the glass beads, said first end of each cylindrical pin functioning as a connection to a hybrid circuit internally of said box, the second end of each feed-through cylindrical pin being terminated by a generally cylindrical head portion of greater outside diameter than the rest of the pin, said head portion being fixed at a distance from the wall of the box and being provided with an axial bore open at the end of the feed-through and suitable both for receiving a contact of an external connector and for receiving a conductor lead to be soldered thereto, depending on the requirements of a user, said complementary connector comprising a plurality of cylindrical conductive contacts in the form of longitudinally split pins, each of said split pins having a first end portion of suitable length and a diameter to be received axially in the bore of a corresponding feed-through head portion, being held in fixed feed-through matching relationship relative to the other split pins by a support, said support having a first plane surface at a level close to the tips of the split pins and having split-pin receiving bores of a diameter slightly larger than the outside diameter of the head portions, with said head portions being received therein, and means for mounting said split pins within said support bores with a slightly loose fit in order to leave enough play to compensate for dimensional inaccuracy when said split-pins are insertably received within the axial bores of the feed-through cylindrical pins so as to prevent fracture of said beads mounting pins to said hybrid circuit box wall.

2. In combination, a complementary assembly, a hybrid circuit box, said hybrid circuit box having a box wall, a row of feed-throughs projecting through said box wall, glass beads borne by said box wall, each feed-through being in the form of a generally cylindrical pin extending through the thickness of the box wall with first and second ends projecting respectively inside the box and outside the box, said pins being mounted within said box wall by said glass beads such that said pins are sealed by said glass beads and insulated thereby from said box wall, and wherein said through-hole pins have a coefficient of expansion compatible to that of the glass beads, said first end of each cylindrical pin functioning as a connection to a hybrid circuit internally of said box, the second end of each feed-through cylindrical pin being terminated by a generally cylindrical head portion of greater outside diameter than the rest of the pin, said head portion being fixed at a distance from the wall of the box and being provided with an axial bore open at the end of the feed-through and suitable both for receiving a contact of an external connector and for receiving a conductor lead to be soldered thereto, depending on the requirements of a user, said complementary connector comprising a plurality of cylindrical conductive contacts in the form of longitudinally split-pins, each of said split-pins having a first end portion of suitable length and a diameter to be received axially in the bore of a corresponding feed-through head portion, being held in fixed feed-through matching relationship relative to the other split-pins by a support, said support having a first plane surface at a level close to the tips of the split-pins and having split-pin receiving bores of a diameter slightly larger than the outside diameter of the head portions, with said head portions being received therein, wherein said contacts include surface discontinuities beyond the split portions thereof, wherein said support includes corresponding complementary discontinuities such that each contact is locked against longitudinal movement relative to the support, said support being made up of two insulating members which are generally parallelepiped in shape and which are provided with matching bores, said members being assembled so that the matching bores are aligned, with said first ends of said contacts received in the bores of one of said members and the opposite ends of said contacts received in the matching bores of the other member, said contacts being locked against longitudinal movement relative to the support as a whole by said members being assembled to each other, and said bores of said support are sized to said split-pins to form a slightly loose fit therebetween in order to leave enough play to compensate for dimensional inaccuracies when said split-pins are insertably received within the axial bores of the feed-through cylindrical pins, said support being made of metal to connect said contacts electrically to one another, and said support further including a conductive shoe projecting therefrom, means biasing said shoe away from said support such that said shoe makes electrical contact with the box bearing said feed-throughs, thereby insuring that said feed-throughs are all connected to the reference potential of the box.

3. In combination, a hybrid circuit box, and a complementary connector, said hybrid circuit box comprising a hybrid circuit box wall, a row of feed-throughs projecting through said hybrid circuit box wall and sealably and insulatively mounted to said box wall by glass beads, respectively, said feed-through having a coefficient of expansion compatible to that of the glass bead, each feed-through being in the form of a generally cylindrical pin extending axially through the thickness of the box wall with first and second ends projecting respectively inside the box and outside the box, said first end connected to a hybrid circuit, said second end of said feed-through pin terminating in a generally cylindrical head portion of greater outside diameter than the rest of the pin, said head portion being fixed at a distance from the wall of the box and being provided with an axial bore open at the end of the feed-through, suitable both for receiving a contact of an external connector and for receiving a conductor lead to be soldered thereto, depending on the requirements of a user, said complementary connector being releasably connected to said row of feed-throughs, said connector comprising: a plurality of conductive contacts held fixed in a feed-through matching relationship relative to one another in a support, said support being comb-shaped and having teeth engaging in between said feed-throughs, said teeth being split in two by a longitudinally extending slot which receives first end portions of said contacts, each of said first end portions of said contacts being in the shape of a bent blade resiliently mounted on the rest of the contact, and said bent blades engaging corresponding feed-throughs tangentially.

4. The combination according to claim 3, wherein said first end portions in the shape of bent blades are protectively received in the thickness of corresponding ones of the support's teeth.

5. The combination according to claim 3, wherein said first end portions are of rectangular cross section.

6. The combination according to claim 3, wherein said contacts include surface discontinuities beyond said first end portions thereof and wherein said support includes corresponding complementary discontinuities whereby each contact is locked against longitudinal movement and against rotation relative to the support.

7. The combination according to claim 6, wherein said support is made of metal to electrically connect said contacts to one another, said support further including a conductive shoe projecting therefrom, spring means carried by said support and biasing said shoe outwardly therefrom such that said shoe makes electrical contact with the box in which the feed-throughs are mounted, thereby ensuring that the feed-throughs are all connected to a reference potential of the box.

* * * * *